United States Patent [19]

Kim et al.

[11] Patent Number: 4,970,196

[45] Date of Patent: Nov. 13, 1990

[54] METHOD AND APPARATUS FOR THE THIN FILM DEPOSITION OF MATERIALS WITH A HIGH POWER PULSED LASER

[75] Inventors: Boris F. Kim, Laurel; Joseph Bohandy, Columbia; Frank J. Adrian, Olney, all of Md.

[73] Assignee: The Johns Hopkins University, Baltimore, Md.

[21] Appl. No.: 235,817

[22] Filed: Aug. 19, 1988

Related U.S. Application Data

[63] Continuation-in-part of Ser. No. 3,435, Jan. 15, 1987, abandoned.

[51] Int. Cl.[5] .......................... B05D 3/06; B05D 1/02
[52] U.S. Cl. ........................................ 505/1; 427/422; 427/531; 505/732
[58] Field of Search ................... 427/53.1, 422, 42; 118/620, 506, 300; 505/1, 732, 848, 826

[56] References Cited

U.S. PATENT DOCUMENTS

| 3,560,258 | 2/1971 | Brisbane | 430/391 |
|---|---|---|---|
| 3,964,389 | 6/1976 | Peterson | 427/53.1 |
| 4,064,205 | 12/1977 | Landoman | 427/53.1 |
| 4,081,653 | 3/1978 | Koo et al. | 427/53.1 |
| 4,245,003 | 1/1981 | Oransky et al. | 427/53.1 |
| 4,714,628 | 12/1987 | Eloy | 427/53.1 |
| 4,752,455 | 6/1988 | Mayer | 427/53.1 |
| 4,895,735 | 1/1990 | Cook | 427/96 |

FOREIGN PATENT DOCUMENTS 2523982 12/1976 Fed. Rep. of Germany .

OTHER PUBLICATIONS

Alexander et al., "Laser-Driven Micro-Explosive Bonding of Al films to Cu & Si", pp. 2181-2186, *Jour. Mat. Sci.*, 23, (1988).

Kenneth Mason Pub. Ltd., England, "Laser Ablation for Pattern High $T_c$ Super-Conducting Materials", *Research Disclosure*, Jul. 1988, #291.

Inam et al., "Pulsed Laser Etching of High $T_c$ Superconducting Films", *Appl. Phys. Lett.*, 51 (14), Oct. 5, 1987, pp. 1112-1114.

Kawai et al., "Formulation & Processing of High $T_c$ Superconductor Films w/Pulsed Excimer Laser", *Mat. Res. Soc. Symp. Proc.*, vol. 99, held Dec. 4, 1987, pp. 327-330.

Burton & Batholomew, "Reactive Laser Deposition of High-$T_c$ Superconducting Thin Films", *High-Temperature Superconductor II*, ed. Capone II et al., 4/9/88, pp. 77-80.

Burton et al., "Laser Deposition of $YBa_2Cu_3O_{7-\delta}$ Thin Films", pp. 166-173, *American Vac. Soc. Series*, 3, 11/6/87.

Lynds et al., "High $T_c$ Superconducting Thin Films Prepared by Pulsed Nd:YAG Laser Ablation", pp. 159-165, *Amer. Vac. Soc. Series*, 3, 11/06/87.

(List continued on next page.)

*Primary Examiner*—Norman Morgenstern
*Assistant Examiner*—Marianne L. Padgett
*Attorney, Agent, or Firm*—Robert E. Archibald; Mary Louise Beall

[57] ABSTRACT

The present invention provides an apparatus and method for laser direct writing of materials onto a receiving substrate using a high power pulsed laser. The invention includes a pulsed laser light source, a receiving substrate, disposed opposite the pulsed laser light source, and an optically transparent source support substrate positioned between the receiving substrate and the pulsed laser light source, wherein a surface of the optically transparent source support substrate facing the receiving substrate has coated thereon a thin film of material to be deposited on the receiving substrate. Laser direct writing using the invention is accomplished by impinging the thin film of material with a pulsed laser light from the pulsed laser light source causing material to be selectively "blown off" the optically transparent source support substrate and deposited onto the surface of the receiving substrate.

11 Claims, 1 Drawing Sheet

OTHER PUBLICATIONS

Kwok et al., "Laser Induced Deposition of $YBa_2Cu_3O_7$ Thin Films", *Mat. Res. Soc. Symp. Proc.*, vol. 99, held Dec. 4, 1987, pp. 735–738.

Weimer et al., "Plasma Emission Monitoring During Laser Ablation Thin Film Dep. of High $T_c$ Superconductor $YBa_2Cu_3O_7$", *High-Temp. Superconductor II*, 4/9/88, pp. 137–140.

Weimer, "Plamsa Emission from Laser Ablation of the High $T_c$–Supercon. $YBa_2Cu_3O_7$", *Appl. Phys. Lett.*, 52 (25), Jun. 20, 1988, pp. 2171–2173.

Adrian et al., "A Study of the Mech. of Metal Dep. by the Laser Induced Forward Transfer Process", *J. Vac. Sci. Technol.*, B5 (5), Sep./Oct. 87, pp. 1490–1494.

R. T. Hodgson et al., "Ohmic Contacts Made by Lasers", *IBM Tech. Dis. Bull.*, vol. 21, No. 10, Mar. 1979, p. 4286.

D. D. Bronson, Jr. et al., "Printing by Means of a Laser Beam", *IBM Tech. Disc. Bull.*, vol. 7, No. 3, Aug. 1964, p. 224.

R. J. von Gutfeld, "Enhancing Ribbon Transfer Using Laser Printing", *IBM Tech. Dis. Bull.*, vol. 17, No. 6, Nov. 1974, p. 1807.

D. J. Ehrlich, "Early Applications of Laser Direct Patterning", *Solid State Techn.*, Dec. 1985, p. 81.

139 mJ 110 mJ 77 mJ 60 mJ

METHOD AND APPARATUS FOR THE THIN FILM DEPOSITION OF MATERIALS WITH A HIGH POWER PULSED LASER

STATEMENT OF GOVERNMENT INTEREST

The Government has rights in this invention pursuant to Contract No. N00024-85-C-5301 awarded by the Department of the Navy.

BACKGROUND OF THE INVENTION

The application is a continuation-in-part of U.S. patent application Ser. No. 003,435, filed Jan. 15, 1987, now abandoned.

The invention concerns a method and apparatus for depositing materials onto a substrate.

There has been extensive work on laser assisted deposition, doping, and etching of materials in the field of integrated circuit fabrication techniques. In particular, laser assisted deposition, commonly called laser direct writing, has extensive applications in custom device fabrication, modification and repair of existing integrated circuit devices, modification and repair of masks, circuit prototyping, and interactive circuit design. Laser direct writing would provide a simpler, faster and less expensive alternative to X-ray, electron beam, or ion beam lithography.

The initial work and much of the subsequent work in this area proposed various methods and apparatus to accomplish laser direct writing. One such prior art method involves ultraviolet photolysis of gas phase precursors to obtain depositions of aluminum, cadmium, zinc, molybdenum, tungsten, and chromium. However, ultraviolet photolysis of gas phase precursors to obtain depositions of copper, silver and gold is limited by the scarcity of suitable metallo-organic precursors.

Another prior art method involves the use of liquid phase schemes to deposit platinum, gold, silver, copper and palladium. The liquid phase containing the desired material is spread across the surface of the substrate. A laser beam is applied to the liquid phase causing selective deposition of the material. A third prior art method makes use of gold chloride doped polymer films to deposit gold. The polymer film is spread across the surface of the substrate. A laser beam is applied to the polymer film causing the selective deposition of gold.

Each of the prior art deposition methods described above suffers from various disadvantages, such as its strong dependence on the thermal properties of the receiving substrate, its dependence on the optical properties of the receiving substrate, its use of chemicals that cause perturbation of the receiving substrate, and handling and contamination problems presented by the use of organo-metallic precursors.

SUMMARY OF THE INVENTION

The present invention solves the above described disadvantages by providing a method and apparatus for the deposition or, in other words, laser direct writing of materials onto a receiving substrate, using a high power pulsed laser. The receiving substrate can be made of either fused silica, silicon or any other substrate. Also, the laser direct writing process as described below can be performed in either air, a gaseous atmosphere or a vacuum. The use of either air, gases or vacuum produces varying degrees of quality and content in the material deposited.

The invention accomplishes the laser direct writing of materials by positioning a receiving substrate opposite a high power pulsed laser source and disposing therebetween an optically transparent source support substrate having coated on one side a thin film of material, of metals such as copper, silver, gold, aluminum, platinum and chromium or ceramics such as $Y_1Ba_2Cu_3O_{7-y}$, Bi-Sr-Ca-CuO and $La_2CuO_4$ or any other material or combinations thereof, for example. The thin film of material can also be a plurality of layers of different types of material. For example, a three layer film can have one layer of gold, a second layer of copper and a third layer of silver. In addition, the thin film of material can be made of a non-metallic material such as a ceramic or an organic polymer. The optically transparent source support substrate can be disposed either with the thin film of material approximate the receiving substrate or with the thin film of material positioned a distance away from the receiving substrate. The pulsed laser beam from the high power pulsed laser is focused onto the thin film of material causing material to be selectively deposited onto the receiving substrate. The laser beam can be made to cause the material to be deposited in any geometric shape such as lines, spots, rectangles and others.

The mechanism whereby the thin film of material is transferred is by thermal ablation of the material in the laser light irradiated region combined with propulsion of the ablated material onto the receiving substrate by the rapidly expanding hot vapor which is trapped between the thin film of material and the source support substrate. The hot vapor is released at the instant the thin film of material ruptures. The transference of the thin film of material can be described as the thin film of material being selectively "blown off" or "exploded off" of the optically transparent source support substrate and deposited onto the surface of the receiving substrate.

The material deposited on the surface of the receiving substrate using the above described process is generally of the same quality and content as the thin film of material coated onto the surface of the optically transparent substrate. However, when the thin film of material is a plurality of layers of different types of material the deposited material produced is a mixture of the layered material.

BRIEF DESCRIPTION OF THE FIGURES

The above and still further features and advantages of the present invention will become more apparent upon consideration of the following detailed description of specific embodiments thereof, especially when considered in conjunction with the accompanying drawings wherein like parts of each of the several figures are identified by the same reference numerals, and wherein.

DETAILED DESCRIPTION OF THE INVENTION

Figure 1:
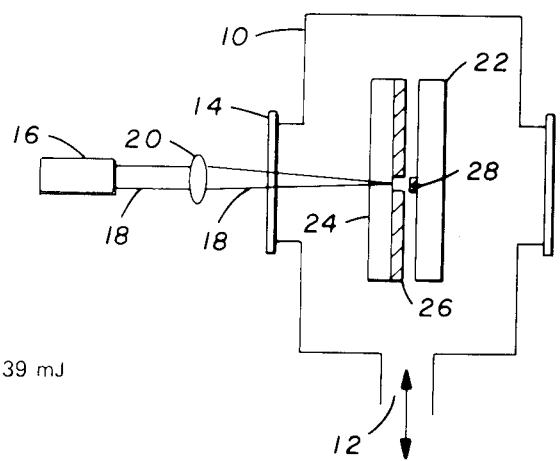
FIG. 1 shows a schematic diagram of the apparatus of the present invention.

FIG. 1 illustrates the apparatus of the present invention as it is used for laser direct writing of materials onto a receiving substrate. The laser direct writing apparatus of the present invention includes a chamber 10 having an inlet/outlet 12 and a transparent window 14 which permits light energy, radiant energy, or electromagnetic energy to enter the chamber 10. The chamber 10 can either be evacuated to create a vacuum, supplied with a gas to create a gaseous atmoshpere or left as is containing air. A vacuum or gaseous atmosphere is used to produce different effects in the quality, character and content of the deposited material. The invention also provides a high power pulsed laser source 16, which may be an excimer or a frequency doubled YAG laser. The high power pulsed laser source 16 is positioned outside the chamber 10 and opposite the transparent window 14. The high power pulsed laser source 16 emits a pulsed laser light 18 which continues through the transparent window 14, to the processing area within the chamber 10. The wavelength of the high power pulsed laser source 16 is set such that the pulsed laser light 18 is primarily absorbed and converted into heat in the material to be deposited. The power of the laser pulse is in the range of 10-200 mJ. A lens system 20 positioned outside the chamber 10 focuses and/or shapes the pulsed laser light into various shapes, such as lines, spots, etc. For example, a laser dot may be deposited by using a spherical lens; a line may be deposited by using a cylindrical lens. Imaging and masking techniques may also be used.

The deposition process is conducted with the apparatus of the present invention by positioning a receiving substrate 22 within the chamber 10 opposite the high powered pulsed laser source 16 which is positioned outside the chamber 10. The receiving substrate 22 can be made of fused silica, silicon or any other substrate. An optically transparent source support substrate 24 is disposed within the chamber 10 between the receiving substrate 22 and the high power pulsed laser source 16. The optically transparent source support substrate 24 has coated on one side a thin film of material 26, such as copper, silver, gold or aluminum or a ceramic material, for example, and is disposed so that the thin film of material 26 is either oposite disposed so that the thin film of material 26 is either opposite to at some distance or approximate the receiving substrate 22. The thin film of material 26 is on the order of $\mu m$ in thickness and can be metallic, non-metallic or contain a plurality of layers of the same or different types of materials. The pulsed laser light 18 from the high power pulsed laser source 16 is focused onto the thin film of material 26 causing material to be selectively deposited onto the surface of the receiving substrate 22 as a deposited material 28. The content of the deposited material 28 is fairly consistent with the content of the thin film of material 26. However, when the thin film of material 26 is a plurality of layers of different types of materials a mixture of the layered materials is produced in the deposited material 28. The shape of the deposited material 28 is in the shape of the laser light focus provided by the lens system 20.

The pulsed laser is focused on the back of the film material at the interface between the film and the optically transparent source substrate. Because the laser is pulsed, not continuous, and the duration of the pulse is on the order of several nanoseconds, the back of the film is subjected to very high laser energy for a very short period of time. This causes the back of the film to boil and vaporize before the front of the film melts. Vaporized film trapped between the source substrate and the unmelted front part of the film rapidly expands or explodes and transfers the remainder of the film to the receiving substrate. Control of the deposit is achieved by focusing and shaping the laser beam.

The mechanism whereby the thin film of material is transferred is by thermal ablation of the material in the laser light irradiated region combined with propulsion of the ablated material onto the receiving substrate by the rapidly expanding hot vapor which is trapped between the thin film of material and the source support substrate. The hot vapor is released at the instant the thin film of material ruptures. The transference of the thin film of material can be described as the thin film of material being selectively "blown off" or "exploded off" of the optically transparent source support substrate and deposited onto the surface of the receiving substrate. This is a vapor-driven propulsion of material from the film onto the receiving substrate.

Figure 2:
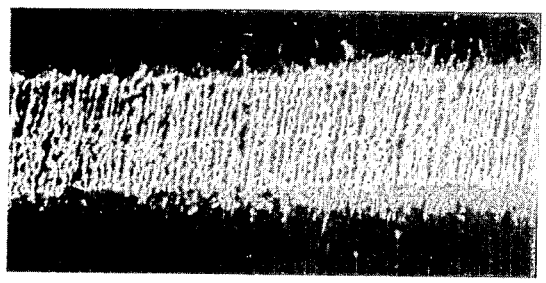
FIG. 2 shows a series of pictures of the magnified surface of a receiving substrate after deposition at various laser power settings.
Figure 2:
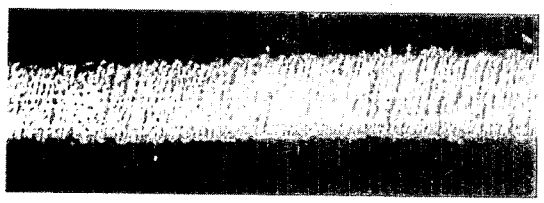
Figure 2:
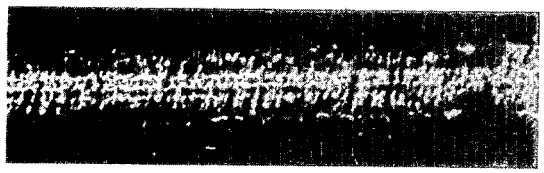
Figure 2:

One proposed mode of operation of the present invention which has been demonstrated as being operable involves the optically transparent source support substrate disposed in approximate contact with the receiving substrate. The chamber is evacuated to a vacuum of approximately $10^{-6}$ torr. The high power pulsed laser, in this example, is an excimer laser, operating in the stable resonator configuration at a wavelength of 193 nm with a pulse duration of approximately 15 nsec. The wavelength of the high power pulsed laser is set such that the laser light is primarily absorbed and converted into heat in the thin film. FIG. 2 shows examples of a series of photographs of the magnified surface of a silicon receiving substrate having deposited thereon a strip of copper from an optically transparent fused silica substrate. The photographs show the width and the character of the lines produced by the proposed mode of operation described above at different power settings of the high power pulsed laser, namely 60, 77, 110 and 139 mJ. It should be noted that the mode of operation of the present invention can be varied by altering such parameters as the laser power and the source support substrate to receiving substrate distance which may cause corresponding variations in the size, type and quality of deposition.

Figure 3:
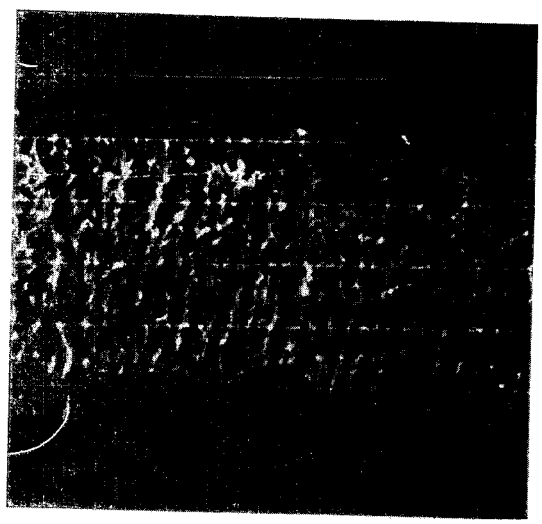
FIG. 3 is a picture of the magnified surface of a receiving substrate with copper X-ray fluorescence counts noted at various points along the deposition line.

FIG. 3 shows relative X-ray fluorescence counts for the deposited material at various positions across the 110 mJ deposition shown in FIG. 2. Rastering across the deposition at the indicated positions gave some degree of averaging. The photograph in FIG. 3 shows a fairly uniform copper distribution across the width of the deposition line. In addition, the copper deposition lines passed the "tape test" for adhesion, that is, they were not removed by placing a piece of "Scotch" tape over the depositions and peeling back the tape. Furthermore, the adhesion of the depositions was not affected by the thermal shock of placing them in liquid nitrogen. Finally the electrical conductivity of the depositions was comparable to the conductivity of depositions produced by other methods.

The present invention finds its greatest potential as a metallization technique in integrated circuit fabrication technology. Some of the expected uses of the present invention would be for post fabrication processing, production of novel materials such as amorphous metals, circuit prototyping, interactive circuit design, custom device fabrication and modification and repair of existing devices and masks.

Having described a preferred embodiment of a method and apparatus for depositing materials using a high power pulsed laser, it is believed that other modifications, variations and changes will be suggested to those skilled in the art in view of the teachings set forth herein. It is, therefore, to be understood that all such variations, modifications and changes are believed to fall within the scope of the present invention as defined by the appended claims.

What is claimed is:

1. A process for depositing a shaped thin film of material comprising:
   providing a pulsed laser emitting a pulsed laser beam;
   providing a receiving substrate disposed opposite the pulsed laser;
   providing an optically transparent source support substrate disposed between the receiving substrate and the pulsed laser, the source support substrate facing the receiving substrate being provided with a thin film of material to be deposited on the receiving substrate, the thin film having a back surface in contact with the source support substrate and a front surface facing the receiving substrate;
   providing a lens system;
   focusing the pulsed laser beam on the back surface of the thin film at the interface between the source support substrate and the back surface with the lens system while shaping the laser beam with the lens system;
   boiling and vaporizing a shaped portion of the back surface of the thin film through the action of the pulsed, shaped laser beam and trapping the thus produced vapor between the source support substrate and the thin film of material; and
   transferring a shaped portion of the thin film of material by exploding the trapped vaporized shaped portion of the back surface of the thin film and driving the thin film from the source support substrate onto the receiving substrate;
   wherein the material transferred is substantially of the same quality and content as the thin film of material.

2. A process according to claim 1, wherein the optically transparent source material is disposed approximate the receiving substrate.

3. A process according to claim 1, wherein laser beam energy is absorbed and converted into heat at the back surface of the thin film.

4. A process according to claim 3, wherein the heat causes the back surface of the thin film to boil and vaporize before the front surface is melted.

5. A process according to claim 4, wherein the thin film is metallic.

6. A process according to claim 5, wherein the thin film is at least one of copper, silver, gold, aluminum, platinum and chromium.

7. A process according to claim 4, wherein the thin film is non-metallic.

8. A process according to claim 7, wherein the thin film is a ceramic selected from the group consisting of $Y_1Ba_2Cu_3O_{7-y}$, Bi-Sr-Ca-CuO and $La_2CuO_4$.

9. A process according to claim 4, wherein the pulsed laser is an excimer laser.

10. A process according to claim 4, wherein the source support substrate is disposed in approximate contact with the receiving substrate within an evacuated chamber or a chamber containing a gaseous atmosphere.

11. A process according to claim 4, wherein the laser is an excimer laser having a wavelength of 193 nm and operating at high power in the range of 10–200 mJ with a pulse duration of approximately 15 nsec.

* * * * *